US011452235B2

(12) United States Patent
Gong et al.

(10) Patent No.: US 11,452,235 B2
(45) Date of Patent: Sep. 20, 2022

(54) CASE HEAT DISSIPATION STRUCTURE (71) Applicant: SUNGROW POWER SUPPLY CO., LTD., Anhui (CN)

(72) Inventors: Shengwei Gong, Anhui (CN); Xiaolei Shi, Anhui (CN); Pengli Ai, Anhui (CN); Gaozhou Tao, Anhui (CN)

(73) Assignee: SUNGROW POWER SUPPLY CO., LTD., Anhui (CN)

( * ) Notice: Subject to any disclaimer, the term of this patent is extended or adjusted under 35 U.S.C. 154(b) by 0 days.

(21) Appl. No.: 17/133,155

(22) Filed: Dec. 23, 2020

(65) Prior Publication Data
US 2021/0212239 A1 Jul. 8, 2021

(30) Foreign Application Priority Data
Jan. 6, 2020 (CN) .......................... 202010012224.X (51) Int. Cl.
*H05K 7/20* (2006.01)
*F28D 21/00* (2006.01)
(52) U.S. Cl.
CPC ......... *H05K 7/20254* (2013.01); *H05K 7/202* (2013.01); *H05K 7/20136* (2013.01);
(Continued)
(58) Field of Classification Search
CPC .................................................... H05K 7/202
See application file for complete search history.

(56) References Cited

U.S. PATENT DOCUMENTS 9,095,075 B2 * 7/2015 Downing ............... H05K 7/202
9,680,385 B2 * 6/2017 Pietrantonio ...... H05K 7/20927
(Continued)

FOREIGN PATENT DOCUMENTS

CN 201781409 U 3/2011
CN 202310424 U 7/2012
(Continued)

OTHER PUBLICATIONS

Extended European Search Report regarding Application No. 20216314.3 dated May 20, 2021.
(Continued)

*Primary Examiner* — Zachary Pape
(74) *Attorney, Agent, or Firm* — Harness, Dickey & Pierce, P.L.C.

(57) ABSTRACT

A case heat dissipation structure is provided, which includes a case, a heat exchange assembly and a fan assembly. The case has a first heat dissipation chamber and a second heat dissipation chamber that are communicated with each other, and multiple heat sources are mounted in the first heat dissipation chamber and the second heat dissipation chamber, a liquid inlet for cooling liquid to flow in and a liquid outlet for cooling liquid to flow out are provided on the case. The heat exchange assembly is mounted in the first heat dissipation chamber, the heat exchange assembly comprises a heat exchanger, which is arranged between the liquid inlet and the liquid outlet. The fan assembly is mounted in the first heat dissipation chamber or the second heat dissipation chamber, and is used for driving the air in the first heat dissipation chamber and the second heat dissipation chamber to circulate mutually in operation.

4 Claims, 3 Drawing Sheets (52) U.S. Cl.
CPC ..... *H05K 7/20609* (2013.01); *H05K 7/20909* (2013.01); *H05K 7/20927* (2013.01); *F28D 2021/0031* (2013.01)

(56) References Cited

U.S. PATENT DOCUMENTS

| | | | |
|---|---|---|---|
| 10,375,851 B2 * | 8/2019 | Agnaou | ............ H05K 7/20909 |
| 2009/0086434 A1 * | 4/2009 | Hodes | ................ H05K 7/20754 |
| | | | 361/700 |

FOREIGN PATENT DOCUMENTS

| | | | | |
|---|---|---|---|---|
| CN | 202435300 | U | | 9/2012 |
| CN | 202513813 | U | | 10/2012 |
| CN | 103956888 | A | | 7/2014 |
| CN | 206100754 | U | | 4/2017 |
| CN | 207219278 | U | * | 4/2018 |
| CN | 209267461 | U | | 8/2019 |
| IT | BO20130419 | A1 | | 2/2015 |
| JP | H08186388 | A | | 7/1996 |
| WO | WO-2013076853 | A1 | | 5/2013 |
| WO | WO-2019018681 | A1 | * | 1/2019 ............. H05K 7/202 |

OTHER PUBLICATIONS

First Chinese Office Action regarding Application No. 202010012224.X dated Mar. 1, 2021. English translation provided by Unitalen Attorneys at Law.

* cited by examiner

CASE HEAT DISSIPATION STRUCTURE

CROSS REFERENCE TO RELATED APPLICATIONS

This application claims the priority to Chinese patent application No. 202010012224.X, titled "CASE HEAT DISSIPATION STRUCTURE", filed with the China National Intellectual Property Administration on Jan. 6, 2020, the entire disclosure of which is hereby incorporated by reference.

FIELD

The present application relates to the technical field of heat dissipation, and in particular to a case heat dissipation structure.

BACKGROUND

A large number of electronic components and various heat-generating devices are generally provided in the case of existing DC/DC converters, inverters, AC/DC power supplies and other equipment, and the heat of these heat-generating devices is usually transferred by the substrates attached to various radiators. When there are many heat sources inside the case, the radiators may occupy much mounting space in the case, and some radiators need to be communicated with the outside of the case to cooperate with each other, which may be inconvenient for the mounting of various components inside the case. In addition, due to the limitation of safety regulations and reliability, some heating devices can hardly be directly attached to the substrate surface of the radiator for heat dissipation, such as current-carrying copper bars or some heating devices with uneven outer surfaces, and the heat dissipation effect of the case is poor.

SUMMARY

A case heat dissipation structure is provided the present application is to provide, which aims at improving the heat dissipation capacity of the case and improving the utilization rate of the case space.

The present application provides a case heat dissipation structure, and the case heat dissipation structure includes:

a case, which has a first heat dissipation chamber and a second heat dissipation chamber that are communicated with each other, where multiple heat sources are mounted in the first heat dissipation chamber and the second heat dissipation chamber, a liquid inlet for cooling liquid to flow in and a liquid outlet for cooling liquid to flow out are provided on the case;

a heat exchange assembly, which is mounted in the first heat dissipation chamber, specifically, the heat exchange assembly includes a heat exchanger, the heat exchanger is arranged between the liquid inlet and the liquid outlet and is communicated through a liquid cooling pipeline;

a fan assembly, which is mounted in the first heat dissipation chamber or the second heat dissipation chamber, and is used for driving the air in the first heat dissipation chamber and the second heat dissipation chamber to circulate mutually and carry out heat exchange treatment through the heat exchanger in operation.

In an embodiment, a liquid cooling plate or an isolation plate is mounted in the case to form the first heat dissipation chamber and the second heat dissipation chamber; both ends of the liquid cooling plate or the isolation plate are respectively provided with an air outlet and an air return port.

In an embodiment, the air outlet is located at one end, extending along an air exhaust side direction of the fan assembly, of the liquid cooling plate or the isolation plate; the air return port is located at one end, extending along the direction of an air suction side of the fan assembly, of the liquid cooling plate or the isolation plate.

In an embodiment, the first heat dissipation chamber is located at the lower side of the liquid cooling plate or the isolation plate. The heat exchanger is mounted between the middle part of the liquid cooling plate or the isolation plate and the case bottom plate and is arranged along the direction perpendicular to the liquid cooling plate or the isolation plate. The heat exchanger is located on the suction side of the fan assembly and arranged close to each other.

In an embodiment, a first pipe joint and a second pipe joint are mounted on the case to form the liquid inlet and the liquid outlet; and the heat exchanger has a first communication port and a second communication port;

The first pipe joint and the first communication port are in communication through a liquid cooling pipeline, and the second pipe joint and the second communication port are in communication through a liquid cooling pipeline.

The present application further provides a case heat dissipation structure, and the case heat dissipation structure includes:

a case, which includes an air duct and multiple heat dissipation chambers that are stacked and communicated with each other, specifically, the heat dissipation chamber at the top layer of the case is in communication with the heat dissipation chamber at the bottom layer of the case through the air duct, heat sources are mounted in multiple heat dissipation chambers, a liquid inlet for cooling liquid to flow in and a liquid outlet for cooling liquid to flow out are provided on the case;

a heat exchange assembly, which is mounted in each heat dissipation chamber or is mounted in part of the heat dissipation chambers, specifically, the heat exchange assembly includes a heat exchanger, the heat exchanger is arranged between the liquid inlet and the liquid outlet and is communicated through a liquid cooling pipeline;

a fan assembly, which is mounted in the heat dissipation chamber, and is used for driving the air in the heat dissipation chamber of this layer of the case to be transported to the heat dissipation chamber of the upper layer and subjected to heat exchange treatment through the heat exchanger, and driving the air in the heat dissipation chamber at the top layer of the case to flow back to the heat dissipation chamber at the bottom layer of the case through the air duct in operation.

In an embodiment, multiple liquid cooling plates or isolation plates spaced apart are mounted in the case to form multiple heat dissipation chambers; both ends of the liquid cooling plate or the isolation plate are respectively provided with an air return port.

In an embodiment, the fan assembly is mounted on one side of each heat exchange assembly, and the relative mounting position of the heat exchange assembly and the fan assembly in two adjacent heat dissipation chambers are oppositely arranged.

The air outlet is arranged at one end, extending along the air exhaust side direction of the fan assembly, of the liquid cooling plate or the isolation plate, and the air outlets of two adjacent liquid cooling plates or the isolation plate are staggered.

In an embodiment, the air duct is arranged at one end, far away from the air outlet direction of the liquid cooling plate or the isolation plate at the top or bottom, of the case, so as to communicate the heat dissipation chamber at the top layer of the case with the heat dissipation chamber at the bottom layer of the case.

In an embodiment, multiple groups of first pipe joints and second pipe joints are mounted on the case to form multiple groups of the liquid inlet and the liquid outlet, and each heat exchanger is provided with a first communication port and a second communication port;

Each first pipe joint and the corresponding first communication port are in communication through a liquid cooling pipeline, and each second pipe joint and the corresponding second communication port are in communication through a liquid cooling pipeline.

In the technical solution of the present application, since the case has the first heat dissipation chamber and the second heat dissipation chamber that are communicated with each other, and multiple heat sources are respectively mounted in the first heat dissipation chamber and the second heat dissipation chamber, the liquid inlet for cooling liquid to flow in and the liquid outlet for cooling liquid to flow out are provided on the case; the heat exchange assembly is mounted in the first heat dissipation chamber, the heat exchanger of the heat exchange assembly is arranged between the liquid inlet and the liquid outlet and is communicated through the liquid cooling pipeline; the fan assembly is mounted in the first heat dissipation chamber or the second heat dissipation chamber, and is used for driving the air in the first heat dissipation chamber and the second heat dissipation chamber to circulate mutually and carry out heat exchange treatment through the heat exchanger in operation, by combining liquid cooling with air cooling to dissipate heat from the heat source in the case, the heat dissipation effect of the case heat dissipation structure is improved, and the space utilization rate of the case is also improved.

BRIEF DESCRIPTION OF THE DRAWINGS

For more clearly illustrating embodiments of the present application or technical solutions in the conventional technology, the drawings referred to for describing the embodiments or the conventional technology will be briefly described hereinafter. Apparently, the drawings in the following description are only some examples of the present application, and for those skilled in the art, other drawings may be obtained based on the provided drawings without any creative efforts.

REFERENCE NUMERALS

| | |
|---|---|
| 100 case | 100A1 first heat dissipation chamber |
| 200 heat exchange assembly | 100A2 second heat dissipation chamber |
| 210 heat exchanger | 100A heat dissipation chamber |
| 220 liquid cooling pipeline | 130A liquid inlet |
| 300 fan assembly | 140A liquid outlet |
| 120 liquid cooling plate | 110 heat source |
| 120A air outlet | 120B air return port |
| 130 first pipe joint | 140 second pipe joint |
| 210A first communication port | 210B second communication port |
| 100B air duct | |

The realization of the objectives, functional characteristics and advantages of the present application will be further described in conjunction with the embodiments and with reference to the drawings.

DETAILED DESCRIPTION

The technical solutions in the embodiments of the present application will be described clearly and completely hereinafter in conjunction with the drawings in the embodiments of the present application. The described embodiments are only a part of the embodiments of the present application, rather than all embodiments. Based on the embodiments in the present application, all of other embodiments, made by the person skilled in the art without any creative efforts, fall into the scope of the present application.

It should be noted that, all directional indicators (such as up, down, left, right, front, back, . . . ) in the embodiment of the present application are only used for explaining a relative position relationship and movement situation among components in a certain specific posture (as shown in the attached figure). If the specific posture changes, the directional indicators will change accordingly.

In addition, in the present application, the description involving "first", "second", etc. are only used for description purposes, and cannot be understood as indicating or implying their relative importance or implicitly indicating the number of indicated technical features. Therefore, the features defined with "first" and "second" can include at least one of the features explicitly or implicitly. In addition, the meaning of "and/or" appearing in the whole text is that it includes three parallel solutions, taking "A and/or B" as an example, including A solution, B solution, or a solution that both A and B satisfy. In addition, the technical solutions between the various embodiments can be combined with each other, but they must be based on the realization by a person skilled in the art. When the combination of technical solutions is contradictory or cannot be realized, it should be considered that such a combination of technical solutions does not exist, and is not within the protection scope of the present application.

A large number of electronic components and various heat-generating devices are generally provided in the case of existing DC/DC converters, inverters, AC/DC power supplies and other equipment, and the heat of these heat resources is usually transferred by the substrates attached to various radiators. On one hand, when many heat sources are provided inside the case, these radiators may occupy much mounting space in the case, and some radiators need to be communicated with the outside of the case, which maybe not conducive to the dustproof and waterproof design inside the case, and the manufacture of radiators and the promotion of protection level often have a high cost. On the other hand, due to the limitation of safety regulations and reliability, some heating devices can hardly be directly attached to the substrate surface of the radiator for heat dissipation, such as current-carrying copper bars or some heating devices with uneven outer surfaces, and the heat dissipation effect of the case is poor, which affects the normal operation of electronic components.

Therefore, the present application provides a case heat dissipation structure, which is suitable for DC/DC converters, inverters, AC/DC power supplies and other devices and not limited hereto.

Figure 1:
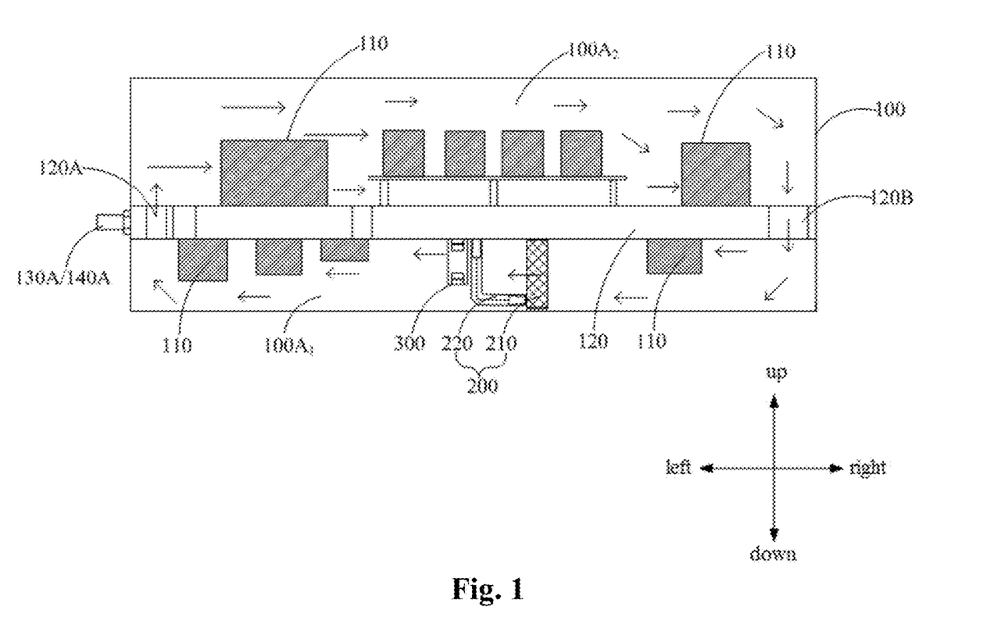
FIG. 1 is a side view of a closed double-layer case in an embodiment of the case heat dissipation structure of the present application.
Figure 2:
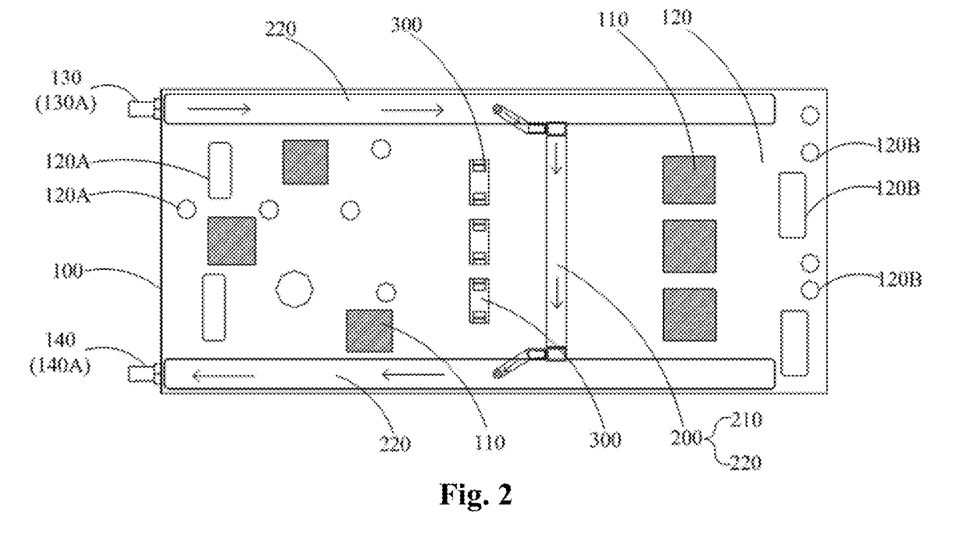
FIG. 2 is a top view of a closed double-layer case in an embodiment of the case heat dissipation structure of the present application.

Referring to FIG. 1 to FIG. 2, in an embodiment of the present application, the case heat dissipation structure includes a case 100, a heat exchange assembly 200 and a fan assembly 300, the case 100 has a first heat dissipation chamber 100A1 and a second heat dissipation chamber 100A2 that are communicated with each other. Multiple heat sources 110 are respectively mounted in the first heat dissipation chamber 100A1 and the second heat dissipation chamber 100A2. A liquid inlet 130A for cooling liquid to flow in and a liquid outlet 140A for cooling liquid to flow out are provided on the case 100. A heat exchange assembly 200 is mounted in the first heat dissipation chamber 100A1. The heat exchange assembly 200 includes a heat exchanger 210. The heat exchanger 210 is arranged between the liquid inlet 130A and the liquid outlet 140A and is communicated through a liquid cooling pipeline 220. The fan assembly 300 is mounted in the first heat dissipation chamber 100A1 or the second heat dissipation chamber 100A2, and is used for driving the air in the first heat dissipation chamber 100A1 and the second heat dissipation chamber 100A2 to circulate mutually and carry out heat exchange treatment through the heat exchanger 210 when in operation. Of course, under some special circumstances, the heat exchange assembly 200 and the fan assembly 300 may be mounted in both the first heat dissipation chamber 100A1 and the second heat dissipation chamber 100A2 to improve the heat dissipation effect. The number and mounting position of the heat exchange assembly 200 and the fan assembly 300 are not limited here.

It should be noted that, the first heat dissipation chamber 100A1 may be located at an upper part or a lower part of the case 100, and is not limited to a certain position, and the position of the second heat dissipation chamber 100A2 communicated with the first heat dissipation chamber 100A1 is not limited. A detailed description will be given below by taking the first heat dissipation chamber 100A1 at the lower part of the case 100 and the second heat dissipation chamber 100A2 at the upper part of the case 100 as an example.

In this embodiment, the case 100 provides a mounting space for the whole device, and also plays a role of protecting the internal components therein. In this embodiment, the case 100 adopts a closed double-layer structure, which is beneficial to the dustproof and waterproof design and noise isolation inside the case 100. The case 100 internally circulates heat without damaging its closed structure, and no other complicated external components are required to realize the protection level of the whole device, which reduces the cost of manufacturing and mounting the radiator and improving the protection level. In addition, there is no need to deliberately increase the size of fans, power or the number of radiators to enhance the heat dissipation performance like the existing case 100. The heat exchange assembly 200 and the fan assembly 300 occupy small space, have high space utilization rate, and save material cost.

Each electronic component (including the heat source 110) can be directly or indirectly arranged on the heat dissipation substrates of the first heat dissipation chamber 100A1 and the second heat dissipation chamber 100A2 inside the case 100. The heat exchanger assembly 200, such as the heat exchanger 210 and the mounting plate for mounting the heat exchanger 210, and the fan assembly 300 may be directly or indirectly mounted at an appropriate position in the middle of the heat dissipation substrate to enhance the heat exchange effect. It is worth mentioning that, the first heat dissipation chamber 100A1 and the second heat dissipation chamber 100A2 may be communicated by setting two communication ports, and the two communication ports may be set at both ends of the middle part of the case 100 to increase the air flow space and further improve the heat dissipation effect of the case heat dissipation structure.

In this embodiment, a fan of the fan assembly 300 may be driven by accessing a driving part and a control device, so that the speed of the fan can be adjusted by the control device setting program. For example, when the internal temperature of the case 100 rises to the first preset temperature value, the fan speed is accelerated to the first preset speed; when the internal temperature of the case 100 drops to the second preset temperature value, the fan speed is reduced to the second preset speed. It can be understood that by adjusting the speed of the fan, the air flow rate can be adjusted, and then the heat exchange effect of the heat dissipation structure of the case can be adjusted, so that the energy loss can be reduced while meeting the proper temperature requirements of various electronic components, thus making the case 100 more energy-saving and environment-friendly. Of course, in some embodiments, for the purpose of reducing the cost of production and manufacturing, the fan can also be set in a constant speed to cooperate with the heat exchanger 210 to dissipate heat. The fan assembly 300 can also include multiple fans, and the number and specific control method thereof are not limited here.

In the case heat dissipation structure provided by this embodiment, a first heat dissipation chamber 100A1 and a second heat dissipation chamber 100A2 that are communicated with each other are provided in the case 100, and multiple heat sources 110 are respectively mounted in the first heat dissipation chamber 100A1 and the second heat dissipation chamber 100A2, and a liquid inlet 130A for cooling liquid to flow in and a liquid outlet 140A for cooling liquid to flow out are provided on the case 100; the heat exchange assembly 200 is mounted in the first heat dissipation chamber 100A1, the heat exchanger 210 of the heat exchange assembly 200 is arranged between the liquid inlet 130A and the liquid outlet 140A and is communicated through a liquid cooling pipeline 220; the fan assembly 300 is mounted at one side close to the heat exchanger 210, and the air in the first heat dissipation chamber 100A1 undergoes heat exchange treatment by the heat exchanger 210, and the treated air flows back to the first heat dissipation chamber 100A1 by the power of the fan assembly 300. By combining liquid cooling with air cooling to dissipate heat from the heat source 110 in the case 100, the heat dissipation effect of the case heat dissipation structure is improved, and the space utilization rate of the case 100 is also improved.

Referring to FIG. 1 and FIG. 2, in an embodiment, a liquid cooling plate 120 is mounted in the case 100 to form a first heat dissipation chamber 100A1 and a second heat dissipation chamber 100A2; two ends of the liquid cooling plate 120 are respectively provided with an air outlet 120A and an air return port 120B to communicate with the first heat dissipation chamber 100A1 and the second heat dissipation chamber 100A2. It should be noted that, the electronic components (including the heat source 110), the heat exchange assembly 200, the fan assembly 300, etc. may be directly or indirectly mounted on the liquid cooling plate 120. It is worth noting that, it can also be replaced with an isolation plate mounted with a liquid cooling pipeline 220 to form the first heat dissipation chamber 100A1 and the second heat dissipation chamber 100A2 of the case 100. Two ends of the isolation plate are respectively provided with an air outlet 120A and an air return port 120B to communicate the first heat dissipation chamber 100A1 and the second heat dissipation chamber 100A2. The manner of forming the two heat dissipation chambers 100A is not limited here. It should be noted that, the liquid cooling pipeline 220 includes, but is not limited to, a pipeline connecting the liquid inlet 130A and the liquid outlet 140A. The partition plate and the liquid cooling pipeline 220 may be integrated or separated, and the liquid cooling pipeline 220 may be directly or indirectly mounted on the partition plate. The following description will take the liquid cooling plate 120 as an example, which does not mean that only the liquid cooling plate 120 can be used for forming the first heat dissipation chamber 100A1 and the second heat dissipation chamber 100A2.

Further, referring primarily to FIG. 1, the air outlet 120A is located at one end, extending along the air exhaust side of the fan assembly 300, of the liquid cooling plate 120; the air return port 120B is located at one end, extending in the direction of the suction side of the fan assembly 300, of the liquid cooling plate 120. The first heat dissipation chamber 100A1 is located at the lower side of the liquid cooling plate 120, and the second heat dissipation chamber 100A2 is located at the upper side of the liquid cooling plate 120. The heat exchanger 210 is mounted between the middle part of the liquid cooling plate 120 and the bottom plate of the case 100 and arranged along a direction perpendicular to the liquid cooling plate 120, and the heat exchanger 210 is located at the suction side of the fan assembly 300 and arranged close to each other. The fan of the fan assembly 300 and the heat exchanger 210 of the heat exchange assembly 200 may be mounted in the middle of the first heat dissipation chamber 100A1, and the fan is mounted on the left side of the heat exchanger 210. The air outlet 120A is arranged at the left end of the liquid cooling plate 120, and the air return port 120B is arranged at the right end of the liquid cooling plate 120. Both the air outlet 120A and the air return port 120B may be round or square (referring to FIG. 2), and the number may be one or more. Herein, the shape, size and number of the air outlet 120A and the air return port 120B are not limited.

The principle is that the liquid cooling plate 120 divides the internal space of the case 100 into upper and lower layers (the first heat dissipation chamber 100A1 and the second heat dissipation chamber 100A2). When the fan is running, it draws air relative to the heat exchanger 210, forming a pressure difference on both sides of the fan, so that the hot air with relatively high temperature in the case 100 is cooled to be cold air with relatively low temperature via the heat exchanger 210, and blows to the heat source 110 on the left side of the fan. After that, the cold air from the lower layer of the liquid cooling plate 120 (the first heat dissipation chamber 100A1) flows to the upper layer of the liquid cooling plate 120 (the second heat dissipation chamber 100A2) through the air outlet 120A at the left end, and the air flows from left to right, which in turn performs strong convection heat dissipation on the upper heat source 110, and then flows back to the lower layer of the liquid cooling plate 120 (the first heat dissipation chamber 100A1) through the air return port 120B at the right end of the liquid cooling plate 120, and then performs strong convection heat dissipation on the heat source 110 on the right side of the heat exchanger 210. In this process, the cold air flows through the heat source 110 and takes heat away, so that the temperature of the heat source 110 is lowered, and the temperature of the cold air is gradually increased to hot air with relatively high temperature, and the hot air flows back to the heat exchanger 210 again under the power of the fan for cooling. Then, the heat of the heat exchanger 210 is taken out of the case 100 by the cooling liquid through the liquid cooling pipeline 220, that is, a cycle is completed, and the heat source 110 inside the case 100 is cooled down repeatedly.

In addition, in order to facilitate mounting and improve assembly efficiency, the first pipe joint 130 and the second pipe joint 140 may be mounted on the case 100 to form a liquid inlet 130A and a liquid outlet 140A. In this embodiment, referring to FIG. 3, the heat exchanger 210 has a first communication port 210A and a second communication port 210B. The first pipe joint 130 and the first communication port 210A are in communication through a liquid cooling pipeline 220, and the second pipe joint 140 and the second communication port 210B are in communication through a liquid cooling pipeline 220.

Figure 3:
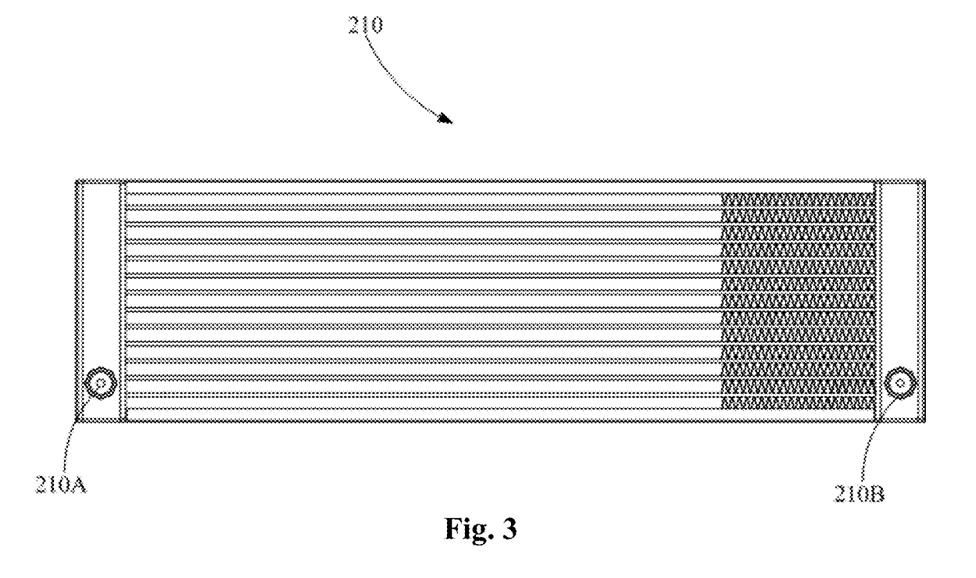
FIG. 3 is a schematic structural diagram of a heat exchanger in an embodiment of the case heat dissipation structure of the present application.

It should be noted that, the liquid cooling pipeline 220 for conveying the cooling liquid may be directly or indirectly mounted on the liquid cooling plate 120. When the cooling liquid flows through the electronic components mounted on the liquid cooling plate 120, it may absorb heat, and it may dissipate the heat of the case 100 with the cooperation of the heat exchanger 210 and the fan, which greatly improves the heat exchange efficiency.

The present application further provides a case heat dissipation structure, and the case heat dissipation structure is a system-level multi-layer closed case heat dissipation structure, which is suitable for equipment with larger specifications of case 100 or more electronic components compared with the above case heat dissipation structure.

Figure 4:
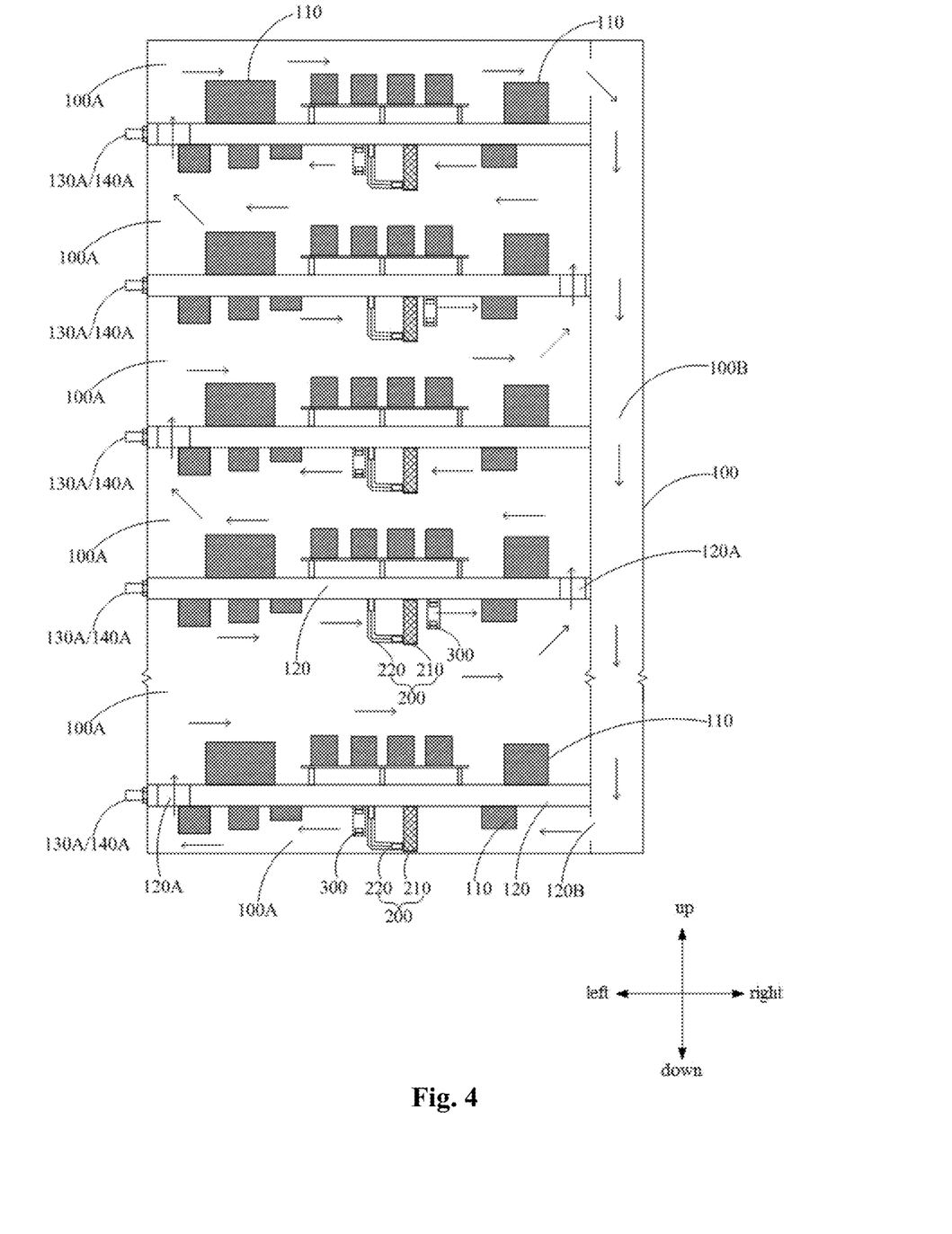
FIG. 4 is a schematic structural diagram of a system-level multi-layer closed case in an embodiment of the case heat dissipation structure of the present application.

Referring to FIG. 4, in an embodiment of the present application, the case heat dissipation structure includes a case 100, a heat exchange assembly 200 and a fan assembly 300. The case 100 has an air duct 100B and multiple heat dissipation chambers 100A which are stacked and communicated with each other, and the heat dissipation chambers 100A at the top of the case 100 are communicated with the heat dissipation chambers 100A at the bottom of the case 100 through the air duct 100B. Heat sources are mounted in multiple heat dissipation chambers 100A, and a liquid inlet 130A for cooling liquid to flow in and a liquid outlet 140A for cooling liquid to flow out are provided on the case 100. The heat exchange assembly 200 is mounted in each heat dissipation chamber 100A or the heat exchange assembly 200 is mounted in part of the heat dissipation chambers 100A. The heat exchange assembly 200 includes a heat exchanger 210, the heat exchanger 210 is arranged between the liquid inlet 130A and the liquid outlet 140A and is communicated through a liquid cooling pipeline 220. The fan assembly 300 is mounted in the heat dissipation chamber 100A, and is used for driving the air in the heat dissipation chamber 100A of this layer of the case 100 to be transported to the heat dissipation chamber 100A of the upper layer and subjected to heat exchange treatment through the heat exchanger 210, and driving the air in the heat dissipation chamber 100A at the top layer of the case 100 to flow back to the heat dissipation chamber 100A at the bottom layer of the case 100 through the air duct 100B.

It should be noted that, since the heat dissipation chamber 100A at the top of the case 100 is in communication with the heat dissipation chamber 100A at the bottom of the case 100 through the air duct 100B, the air in the heat dissipation chamber 100A at the top of the case 100 may flow to the heat dissipation chamber 100A at the bottom for air circulation under the action of gravity or the thrust of the fan assembly 300 at the lower level. In this embodiment, in order to reduce the manufacturing cost, the heat exchange assembly 200 and the fan assembly 300 are not mounted in the top heat dissipation chamber 100A. Here, the number and specific mounting positions of the heat exchange assembly 200 and the fan assembly 300 are not limited.

In this embodiment, in order to speed up the air circulation rate and improve the heat dissipation effect, the fan assembly 300 is mounted on one side of each heat exchange assembly 200, and the relative mounting positions of the heat exchange assembly 200 and the fan assembly 300 in two adjacent heat dissipation chambers 100A are opposite.

In this embodiment, the case 100 forms multiple heat dissipation chambers 100A by arranging multiple liquid cooling plates 120 or a combination of liquid cooling pipelines 220 and isolation plates, etc. The liquid cooling plates 120 or isolation plates may be evenly spaced inside the case 100. The air outlets 120A may be arranged at one end of the liquid cooling plates 120 or the partition plate along the direction from the heat exchange assembly 200 to the fan assembly 300, and the air outlets 120A on every two adjacent liquid cooling plates 120 or the partition plate are staggered (one air outlet 120A is close to the left side of the case 100, and the other air outlet 120A is close to the right side of the case 100). The following description will take the liquid cooling plate 120 as an example, which does not mean that only the liquid cooling plate 120 can be used for forming multiple heat dissipation chambers 100A.

It should be noted that, the heat exchanger 210 may be mounted in the middle of the heat dissipation chamber 100A, and the fan is mounted on one side close to the air outlet 120A on the liquid cooling plate 120 to form an air flow direction from right to left, then from left to right and from bottom to top (or from left to right, then from right to left and from bottom to top, etc.). The air in the topmost heat dissipation chamber 100A of the case 100 flows back to the bottommost heat dissipation chamber 100A of the case 100 through the air duct 100B, and the high-temperature air after passing through the heat source 110 exchanges heat with the heat exchanger 210, and then flows to the air outlet 120A through the fan. The cooling liquid flows to the heat exchanger 210 through the liquid inlet 130A and the communicated liquid cooling pipeline 220, and after absorbing heat, the cooling liquid is discharged through the liquid cooling pipeline 220 and the liquid outlet 140A at the other end, so as to circulate and reciprocate to dissipate heat from the heat source 110 inside the case 100. In addition, in some embodiments, a fan assembly 300 can also be mounted in the heat dissipation chamber located on the top of the case 100 to accelerate air flow and improve heat dissipation efficiency. The specific mounting position of the fan assembly 300 is not limited here.

In this embodiment, the air duct 100B is provided at one end of the case 100 away from the air outlet 120A on the liquid cooling plate 120 located at the top or bottom (i.e., the right side of the case 100 in FIG. 4) to communicate the heat dissipation chamber 100A located at the top and the bottom of the case 100. In addition, the air duct 100B may be a separate exhaust duct to communicate the heat dissipation chambers 100A on the top and the bottom of the case 100, or an air flow channel to communicate the heat dissipation chambers 100A on the top and the bottom of the case 100 may be formed by using isolated spaces such as side plates and internal mounting plates of the case 100, which is not limited here.

It can be understood that, the heat dissipation structure of the system-level multi-layer enclosed case is not the accumulative stacking of the above-mentioned double-layer enclosed case 100, but a system-level optimized layout designed based on the above-mentioned principles. The multi-layer case 100 is divided into multiple compartments by several liquid cooling plates 120, forming multiple heat dissipation chambers 100A, and air outlets 120A are arranged on two liquid cooling plates 120 adjacent to each other in a staggered manner. The heat exchanger 210 is always placed on the suction side of the fan. When the system-level multi-layer closed case 100 operates, the fans arranged in each layer are connected in series, and the internal air flows from the lower heat dissipation chamber 100A to the upper heat dissipation chamber 100A. The heat flow flows from the lower layer of the case 100 to the upper layer. Heat exchanger 210 arranged on each layer transfer heat flow from the lower heat source 110 to the outside of the case 100 through liquid cooling circulation. The temperature of the heat source 110 on each layer and the internal ambient temperature of the case 100 can be reasonably adjusted by controlling the liquid flow rate of the liquid cooling plate 120 on each layer. Finally, the heat flow reaches the heat dissipation chamber 100A on the top of the case 100 and is transferred to the heat dissipation chamber 100A on the bottom through the air duct 100B inside the case 100, so as to circularly dissipate heat of the case 100. It should be noted that, the heat exchanger 210 is arranged on the suction side of the fan, which is beneficial to reducing the air inlet temperature of the fan, increasing the service life of the fan, and has a reasonable layout, which improves the heat dissipation performance of the device.

Further, multiple groups of first pipe joints 130 and second pipe joints 140 are mounted on the case 100 to form multiple groups of liquid inlets 130A and liquid outlets 140A, and each heat exchanger 210 is provided with a first communication port 210A and a second communication port 210B. Each of the first pipe joint 130 and the corresponding first communication port 210A are in communication through a liquid cooling pipeline 220, and each of the second pipe joint 140 and the corresponding second communication port 210B is in communication through a liquid cooling pipeline 220. It should be noted that, the liquid cooling pipeline 220 and the multiple heat exchangers 210 connected thereto may be an independent structure, or a parallel-series structure, etc. The specific layout of the liquid cooling pipeline 220 and the pipe joints is not limited here.

The above is only an optional embodiment of the present application, which does not limit the patent scope of the present application. Under the inventive concept of the present application, any equivalent structural transformation made by using the contents of the specification and drawings of the present application or direct/indirect application in other related technical fields is included in the patent protection scope of the present application.

The invention claimed is:
1. A case heat dissipation structure, comprising:
a case comprising an air duct and a plurality of heat dissipation chambers which are stacked and communicated with each other, wherein the heat dissipation chamber at the top layer of the case is in communication with the heat dissipation chamber at the bottom layer of the case through the air duct, heat sources are respectively mounted in each of the plurality of heat dissipation chambers, and a liquid inlet for cooling liquid to flow in and a liquid outlet for cooling liquid to flow out are provided on the case;

a heat exchange assembly, wherein the heat exchange assembly is mounted in each heat dissipation chamber or the heat exchange assembly is mounted in some of the heat dissipation chambers, each heat exchange assembly comprising a heat exchanger that is arranged between the liquid inlet and the liquid outlet and is communicated through a liquid cooling pipeline;

a fan assembly, which is mounted in at least the heat dissipation chamber of the bottom layer, wherein the fan assembly is used for driving the air in the heat dissipation chamber of the bottom layer of the case to be transported to the heat dissipation a chamber of the top layer and subjected to heat exchange treatment through the heat exchangers, and driving the air in the heat dissipation chamber at the top layer of the case to flow back to the heat dissipation chamber at the bottom layer of the case through the air duct in operation, wherein, a plurality of liquid cooling plates or isolation plates spaced apart are mounted in the case to form the plurality of heat dissipation chambers; and both ends of the liquid cooling plate or the isolation plate are respectively provided with an air return port.

2. The case heat dissipation structure according to claim 1, wherein, the fan assembly is mounted on one side of each heat exchange assembly, and a relative mounting position of the heat exchange assembly and the fan assembly in two adjacent heat dissipation chambers are oppositely arranged; and the air outlet is arranged at one end, extending along the air exhaust side direction of the fan assembly, of the liquid cooling plate or the isolation plate, and the air outlets of two adjacent liquid cooling plates or isolation plates are staggered.

3. The case heat dissipation structure according to claim 2, wherein, the air duct is arranged at one end, far away from the air outlet direction of the liquid cooling a plate or the isolation plate at the top or bottom of the case, so as to communicate the heat dissipation chamber at the top layer of the case with the heat dissipation chamber at the bottom layer of the case.

4. The case heat dissipation structure according to claim 1, wherein, a plurality of groups of first pipe joints and second pipe joints are mounted on the case to form a plurality of groups of liquid inlets and liquid outlets, and each heat exchanger is provided with a first communication port and a second communication port; and each first pipe joint and the corresponding first communication port are in communication through a liquid cooling pipeline, and each second pipe joint and the corresponding second communication port are in communication through a liquid cooling pipeline.

\* \* \* \* \*